(12) United States Patent  
Zettel et al.

(10) Patent No.: US 7,557,583 B2
(45) Date of Patent: Jul. 7, 2009

(54) SYSTEM AND METHOD FOR MONITORING AN ELECTRICAL POWER RELAY IN A HYBRID ELECTRIC VEHICLE

(75) Inventors: Andrew M. Zettel, Ann Arbor, MI (US); Michael J. Miller, Macomb, MI (US); James C. Gibbs, Clinton Township, MI (US); Mary A. Jeffers, Clarkston, MI (US)

(73) Assignee: GM Global Technology Operations, Inc., Detroit, MI (US)

( * ) Notice: Subject to any disclaimer, the term of this patent is extended or adjusted under 35 U.S.C. 154(b) by 219 days.

(21) Appl. No.: 11/285,523

(22) Filed: Nov. 21, 2005

(65) Prior Publication Data

US 2007/0115604 A1 May 24, 2007

(51) Int. Cl.
*G01R 31/327* (2006.01)

(52) U.S. Cl. ....................... 324/418; 324/421

(58) Field of Classification Search ................. 324/418, 324/420–423, 537
See application file for complete search history.

(56) References Cited

U.S. PATENT DOCUMENTS

| | | | | |
|---|---|---|---|---|
| 4,704,652 A | * | 11/1987 | Billings | 361/5 |
| 5,574,632 A | * | 11/1996 | Pansier | 363/49 |
| 5,930,104 A | * | 7/1999 | Kadah et al. | 361/187 |
| 6,330,140 B1 | * | 12/2001 | Wilson-Jones et al. | 324/527 |
| 6,488,107 B1 | * | 12/2002 | Ochiai et al. | 180/65.2 |
| 6,657,833 B2 | * | 12/2003 | Matsuki et al. | 361/23 |
| 6,828,798 B2 | * | 12/2004 | Morimoto | 324/418 |
| 6,909,285 B2 | * | 6/2005 | Jordan et al. | 324/418 |
| 7,038,895 B2 | * | 5/2006 | Imai et al. | 361/23 |
| 7,095,191 B2 | * | 8/2006 | Sakurai | 318/139 |
| 7,242,196 B2 | * | 7/2007 | Yudahira et al. | 324/418 |

* cited by examiner

*Primary Examiner*—Timothy J Dole

(57) ABSTRACT

A method and system to monitor a high voltage power relay operable to conduct electrical power from a source to a load, during each vehicle shutdown event. The system includes the electrical relay with a resistive device, electrically connected in parallel circuit, a controllable electrical load device, and a sensing device. A controller is connected to the electrical relay and each sensing device, and operable to identify a low electrical load condition at the load. The controller commands the load to operate at a known current draw level, commands the relay open, and monitors a change in power to the load device when the relay is commanded open. The electrical relay is functioning properly when the change in electrical power to the load exhibits a known profile over time, when the electrical relay is controlled to the commanded-open position.

15 Claims, 3 Drawing Sheets

SYSTEM AND METHOD FOR MONITORING AN ELECTRICAL POWER RELAY IN A HYBRID ELECTRIC VEHICLE

TECHNICAL FIELD

This invention pertains generally to electrical power control systems, and more specifically to a monitoring system for an electrical power control system on a hybrid electric vehicle.

BACKGROUND OF THE INVENTION

A modern hybrid-electric vehicle ('HEV') employs control devices and wiring circuits having a variety of electrical devices to control and manage flow of electrical power between electrical power storage devices and electrical power generators, including internal combustion engines and regenerative braking systems. Early, accurate detection and diagnosis of a malfunction in a component of the electrical system is important to ensure optimum performance of the HEV. One electrical circuit of interest comprises a power transmission circuit flowing pre-flux current between an electrical energy storage device and an electrical load, e.g. a DC/DC electrical converter. Other circuits of interest include parasitic loads such as electrical power steering or electrical power brakes. A typical circuit contains a power relay that permits flow of electrical power from the energy storage device to the electrical load. A failure of a power relay may reduce the ability of the vehicle to function in hybrid mode, thus affecting fuel economy and performance. Detection of a stuck-open power relay is readily achievable through known means, but detection of a stuck-closed power relay is more challenging to diagnose during ongoing operation of a hybrid electric vehicle.

A typical electrical power relay failure mode in stuck-closed position comprises an action wherein the relay contacts are welded together. Methods to detect stuck-closed failure typically include intrusive methods, which interfere with ongoing operation.

Therefore, what is needed is a method for regularly monitoring a power relay to detect a stuck-closed condition that does not interfere with ongoing vehicle operation, and able to be executed regularly and consistently.

SUMMARY OF THE INVENTION

The present invention provides an improvement over conventional relay monitoring methods in that it provides a method and system to monitor a power relay operable to conduct electrical power from a source to a load, during each vehicle shutdown event. The system includes the electrical relay with a resistive device, electrically connected in parallel circuit, a controllable electrical load device, and at least one sensing device. A controller is operably connected to the electrical relay, signally connected to each sensing device, and operable to identify a low electrical load condition at the load device. The controller commands the controllable load device to operate at a known current draw level, commands the relay open, and monitors a change in electrical power to the load device when the electrical relay is commanded open. The controller determines the electrical relay is functioning properly when the change in electrical power to the load is greater than a predetermined amount, when the electrical relay is controlled to the commanded-open position.

Another aspect of the invention comprises the controller operable to determine the electrical relay is malfunctioning when the monitored change in electrical power to the load device is less than the predetermined amount, when the electrical relay is controlled to the commanded-open position.

Another aspect of the invention comprises the controller operable to identify a shutdown command by an operator.

Another aspect of the invention comprises the controller operable to command the controllable electrical load device to operate at a substantially fixed current level that is less than about one ampere.

Another aspect of the invention comprises the controller signally connected to a sensing device operable to measure a first voltage at an electrical junction created between the source, the relay, and the resistive device; and, signally connected to a sensing device operable to measure a second voltage at an electrical junction created between the electrical load, the relay, and the resistive device. Another aspect of the invention comprises the controller operable to monitor change in electrical voltage between the first voltage and the second voltage when the electrical relay is in the commanded-open position.

Another aspect of the invention comprises the controller signally connected to a current sensing device operable to measure electrical current supplied to the electrical load.

Another aspect of the invention comprises the controller operable to monitor the change in electrical current to the load device while the electrical relay is in the commanded-open position.

Another aspect of the invention comprises the electrical load device being a parasitic load device for a hybrid-electric vehicle.

Another aspect of the invention comprises the electrical relay comprises a pulse-width modulation-controlled high voltage relay device operable to conduct electrical current.

These and other aspects of the invention will become apparent to those skilled in the art upon reading and understanding the following detailed description of the embodiments.

BRIEF DESCRIPTION OF THE DRAWINGS

The invention may take physical form in certain parts and arrangement of parts, the preferred embodiment of which will be described in detail and illustrated in the accompanying drawings which form a part hereof, and wherein.

DETAILED DESCRIPTION OF EMBODIMENTS OF THE INVENTION

Figure 1:
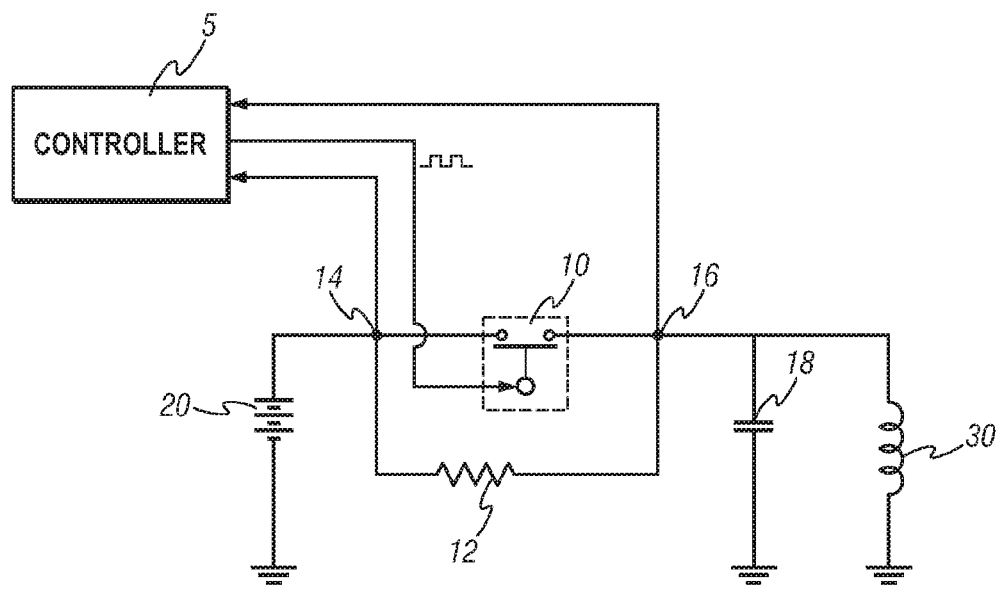
FIG. 1 is a schematic diagram of an electrical circuit, in accordance with the present invention.
Figure 2:
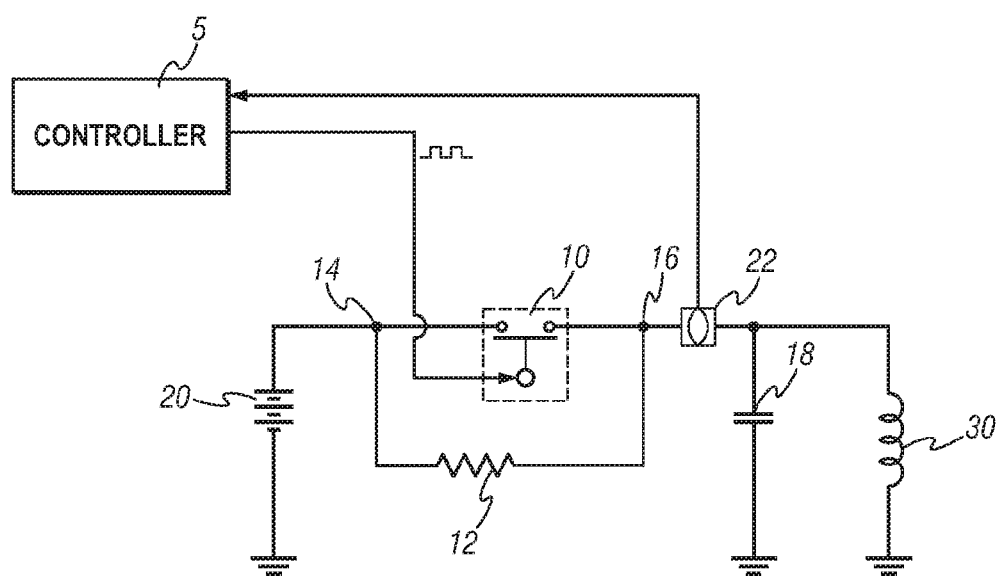
FIG. 2 is a schematic diagram of an electrical circuit, in accordance with the present invention.

Referring now to the drawings, wherein the showings are for the purpose of illustrating the invention only and not for the purpose of limiting the same, FIGS. 1 and 2 show schematic diagrams of electrical circuits which have been constructed in accordance with an embodiment of the present invention. The circuits described herein are intended for application on a hybrid electric vehicle (HEV), but it is understood that the invention may be executed in other applications wherein monitoring of a power relay and diagnosis and detection of any malfunction is desirable. The basic circuit comprises an electrical energy storage device 20, e.g. a battery or other energy storage device electrically connected to power electrical relay device 10 which is electrically connected to a load device 30. The power electrical relay device 10 has a pre-charge resistor 12 electrically in parallel thereto. Electrical wire cables capable of conducting electrical current therethrough form the electrical connections between the energy storage device 20 and the relay 10, and between the relay 10 and the load device 30. A first node 14 is formed at an electrical junction comprising the energy storage device 20, the relay 10, and the pre-charge resistor 12. A second node 16 is formed at an electrical junction comprising the relay 10, and the pre-charge resistor 12, and the electrical load device 30. A charge capacitor 18 is electrically wired in parallel with the load device 30, and is operable to supply a current to the load device 30 under specific operating conditions, typically to smooth out ripple currents created by switching of Insulated Gate Bipolar Transistors (IGBT).

The IGBTs (not shown) comprise switches that convert DC power from the energy storage device 20 to AC power for use by a load device, by switching at high frequencies. There is typically one IGBT for each phase of a three phase electric machine. Because of the high frequencies, capacitors are generally needed to filter the ripple caused by the switching when the load device 30 is operating. There is a control device 5 electrically operably connected to the relay device 10, and operable to monitor inputs from at least one sensing device. Referring specifically to FIG. 1, the control device 5 is signally connected to the first node 14 and the second node 16, and operable to measure electrical voltage levels at each node 14, 16. Referring specifically to FIG. 2, the control device 5 is signally connected to an electrical current sensor 22 operable to monitor electrical current flowing to the load device 30, and preferably located in the circuit after the second node 16.

The controller 5 is preferably an electronic control module comprised of a central processing unit signally electrically connected to volatile and non-volatile memory devices via data buses. The memory devices preferably include RAM devices, ROM devices, and data buffers. The controller 5 includes an analog-to-digital (A/D) converter for obtaining signal data, and a plurality of output drivers for controlling a corresponding plurality of output devices, each operable to control an aspect of HEV operation. The controller 5 is attached to sensing devices and output devices via wiring harnesses, to monitor and control HEV operation. One output device comprises the power electrical relay device 10, which utilizes a pulsewidth-modulated signal for control and ongoing operation. Referring specifically to FIG. 1, sensing devices include signal wires electrically attached to first and second nodes 14, 16, which provide electrical voltage input to the A/D converter. Referring specifically to FIG. 2, sensing devices include the current sensor electrically located in the circuit after the second node 16, and which provides a signal to the A/D converter that is correlatable to electrical current. There are control algorithms included in the ROM area that are typically executed during preset loop cycles so each control algorithm is executed at least once each loop cycle. Loop cycles are typically executed each 3, 6, 15, 20 and 100 milliseconds during ongoing operation. Other algorithms may be executed in response to some form of interrupt signal sent to the controller 5. Use of the control device 5, having various control algorithms and calibrations, to control operation of aspects of a HEV, is well known to one skilled in the art.

The energy storage device 20 of this embodiment comprises a conventional multi-cell battery storage device intended for use on a HEV, and operable to deliver sufficient current amperage to operate the load device 30. Alternatively, the energy storage device may comprise other storage devices, including, for example, an ultracapacitor.

The power electrical relay device 10 of these embodiments preferably comprises a known high current DC-load switching relay, having a rotating contactor and stationary contactor sealed in a vacuum-filled or gas-filled chamber. It is actuated by a spring-loaded armature and coil which receives a pulse-width-modulated controlled signal from the controller 5.

The pre-charge resistor 12 preferably comprises a known 1.5 kil-ohm, 5% resistor device capable of handling two watts of power. The charge capacitor 18 typically comprises a 9000 microfarad device, and intended to smooth out ripple currents created by switching of IGBTs when the load device 30 is operating.

The electrical load device 30 of these embodiments comprises any one of a number of controllable parasitic load devices found on a HEV, including, for example, a DC/DC electrical converter, an electrical power steering device, and an electrical braking device. Each load device is controlled by the control device 5, which is operable to command the controllable electrical load device to operate at a substantially fixed current level. This includes operating at the fixed current level for a time-certain after vehicle shutdown. Typically the fixed current level is in the range of about one ampere, or less.

The overall system for monitoring the electrical relay comprises the electrical relay 10, the resistive device 12, electrically connected to the electrical relay in a parallel circuit, the controllable electrical load device 30, the sensing device, and, the controller 5. The controller 5 is electrically operably connected to the electrical relay 10, and electrically signally connected to each sensing device. In operation, the controller 5 identifies a low electrical load condition at the load device 30, commands the controllable electrical load device 30 to operate at a known current draw level, e.g., commands the electrical relay 10 to a commanded-open position, and monitors a change in electrical power to the controllable electrical load device 30 using the sensor(s) under the aforementioned conditions.

Referring again to FIGS. 1 and 2, during normal vehicle operation the main current path to the load 30 is via the relay 10. The electric load/machine 30 sources or sinks current from the energy storage device 20. Upon removal of all other loads, the controller 5 commands a small current through the electric load/machine 30 referred to as a preflux current. When the relay 10 is closed, the energy storage device 20 supplies the preflux current, whereas current through the parallel path of the precharge resistor 12 approaches zero amperes, because of the relatively high resistance (1.5 k$\Omega$) of the precharge resistor 12.

When the controller 5 identifies a low electrical load condition at the load device 30, e.g., as a result of a vehicle shutdown command from an operator, the controllable electrical load device 30 is commanded to operate at a known current draw level, e.g. one ampere, and the electrical relay 10 is commanded open. In such conditions, when the relay 10 is functioning properly, the relay opens, breaking the electrical contact across the relay 10, and any current passing from the energy storage device 20 to the load device 30 flows through the charge resistor 12. When charge capacitor 18 is utilized in the system, upon the opening of the relay 10, the electrical circuit is electrically described as a voltage source with a conventional RC circuit, comprising the resistor 12 and the capacitor 18 leading to the load 30. When the relay 10 is opened, the capacitor initially supplies the majority of the preflux current to the load device 30, with a small component passing through the resistor 12. This current is represented by Equation 1 below, assuming the preflux current load holds a constant current (I=V/R):

$$Vc = Voe^{-t/RC} \quad [1]$$

wherein Vc equals voltage across the capacitor, and Vo equals voltage at the time when the relay 10 is commanded open. As the capacitor 18 discharges over time, the preflux current, typically in the range of one ampere in this embodiment, becomes more dominant. When the preflux current is not turned off, i.e. the load device 30 is kept operating, the capacitor discharges, and the energy storage device 20 becomes the only source of energy for supplying the preflux current to the load device 30, as well as charging the capacitor 18. As the precharge resistor 12 is typically large (e.g. 1.5 kΩ, in this embodiment) the current is small, hence even the relatively small preflux current could not be supported after the capacitor is fully discharged, and the voltage drops. For example, when the capacitor is fully discharged to one volt, such as when installing a new load device 30, and energy storage device voltage is $V_{batt}$=42 Volts, the initial charge current is only=(42−1)/1500=0.027 A. However, in the event of a failure wherein the relay 10 is stuck in closed position, allowing current to pass through the commanded-open relay, there is a low resistance current flow path from the battery 20 to the load 30. This lengthens discharge time for the capacitor 18, and correspondingly increases decay time for the system voltage to the load after vehicle shut down. This change in resistance is shown in Eq. 2, below, wherein $R_{stuck}$ comprises total circuit resistance, $R_{precharge}$ comprises the resistance of resistor 12, and $R_{stuckcontactor}$ comprises resistance across the relay 10.

$$\frac{1}{Rstuck} = \frac{1}{Rprecharge} + \frac{1}{Rstuckcontactor} \quad [2]$$

In an alternative system (not shown) the basic circuit, absent a capacitor, is described, employing common reference numerals for those components identified in FIG. 1. The basic circuit comprises the electrical power source, e.g. battery 20 electrically connected to power electrical relay device 10 which is electrically connected to load device 30. The power electrical relay device 20 has pre-charge resistor 12 electrically in parallel thereto. Electrical wire cables capable of conducting electrical current therethrough form the electrical connections between the battery 20 and the relay 10, and between the relay 10 and the load device 30. The first node 14 is formed at electrical junction comprising the battery 20, the relay 10, and the pre-charge resistor 12. The second node 16 is formed at the electrical junction comprising the relay 10, and the pre-charge resistor 12, and the electrical load device 30. In this embodiment, there is no charge capacitor wired in parallel with the load device 30. Controller 5 is electrically operably connected to the relay device 10, and operable to monitor inputs from at least one sensing device.

When the controller 5 identifies a low electrical load condition at the load device 30, e.g., as a result of a vehicle shutdown command from the operator, the controllable electrical load device 30 is commanded to operate at a known current draw level, e.g. one ampere, and the electrical relay 10 is commanded open. In such conditions, when the relay 10 is functioning properly, the relay opens, breaking the electrical contact across the relay 10, and any current passing from the battery 20 to the load device 30 flows through the charge resistor 12. When no charge capacitor is utilized in the system, upon the opening of the relay 10, the electrical circuit is electrically described as a voltage source with a conventional resistance circuit, comprising the resistor 12 and leading to the load 30. When the relay 10 is opened, current is dissipated through the resistor 12. This current is represented as I=V/R, assuming the preflux current load holds a constant current (R=V/I). When the preflux current is not turned off, i.e. the load device 30 is kept operating, the battery 20 is the only source of energy for supplying the preflux current to the load device 30. As the precharge resistor 12 is typically large (e.g. 1.5 kΩ, in this embodiment) the current is small, hence even the relatively small preflux current of one amp can not be supported, and the voltage drops. For example, when the capacitor is fully discharged to one volt, such as when installing a new load device 30, and battery voltage is $V_{batt}$=42 Volts, the initial charge current is only=(42−1)/1500=0.027 Amps. However, in the event of a failure wherein the relay 10 is stuck in closed position, allowing current to pass through the commanded-open relay, there is a low resistance current flow path from the battery 20 to the load 30. This change in resistance is shown in Eq. 3, below, wherein $R_{stuck}$ comprises total circuit resistance, $R_{precharge}$ comprises the resistance of resistor 12, and $R_{stuckcontactor}$ comprises resistance across the relay 10.

$$\frac{1}{Rstuck} = \frac{1}{Rprecharge} + \frac{1}{Rstuckcontactor} \quad [3]$$

In this instance, a stuck contactor is detectable by monitoring voltage drop across the resistor, or by monitoring current. When the contactor is working properly, the electrical current flowing to the load is in the range of 0.027 Amps, whereas when the contactor has stuck closed, the current flowing to the load is substantially greater than 0.027 Amps, and therefore detectable.

Figure 3:
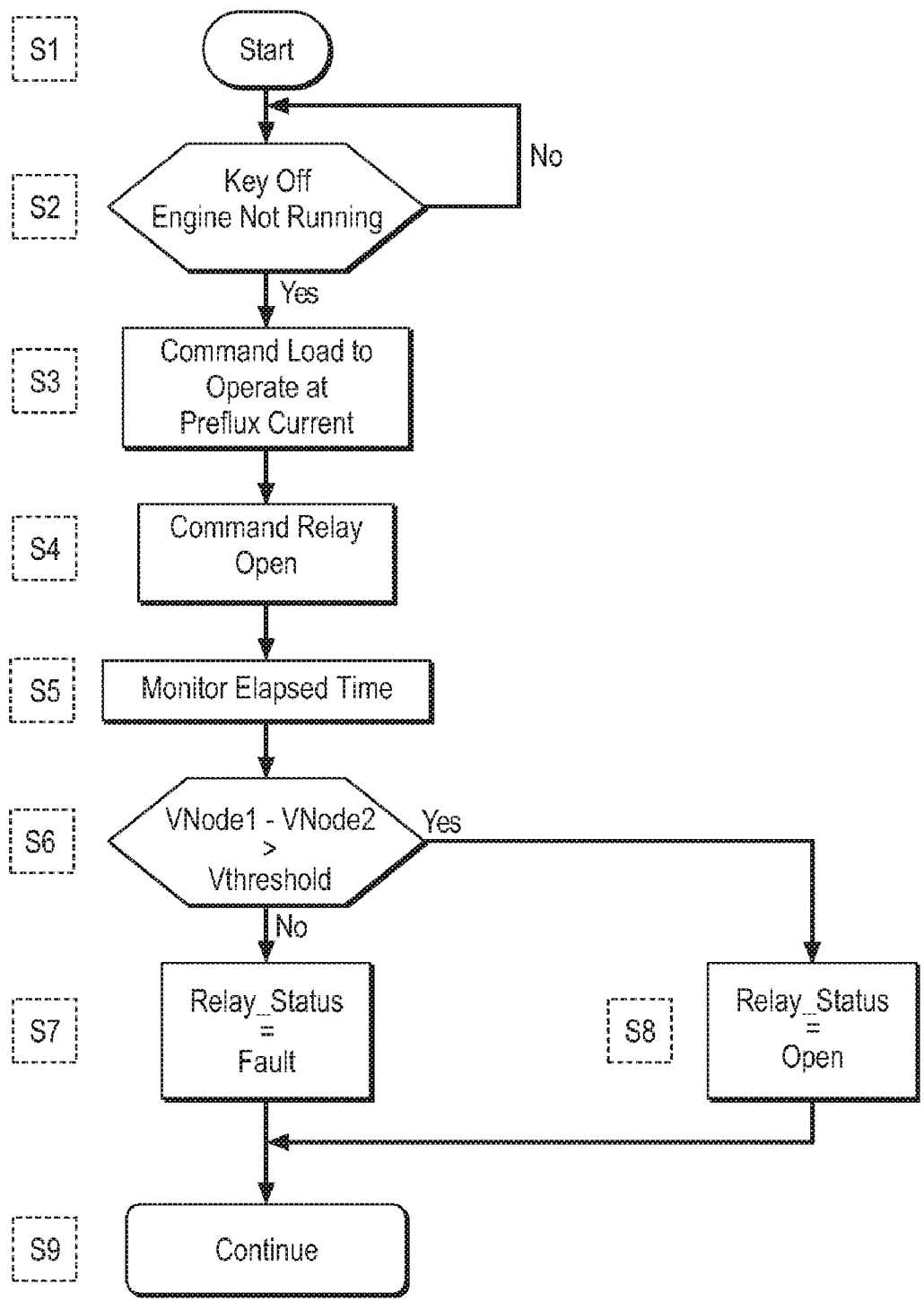
FIG. 3 is an algorithmic flowchart, in accordance with the present invention; and, FIG. 4 is an algorithmic flowchart, in accordance with the present invention.
Figure 4:
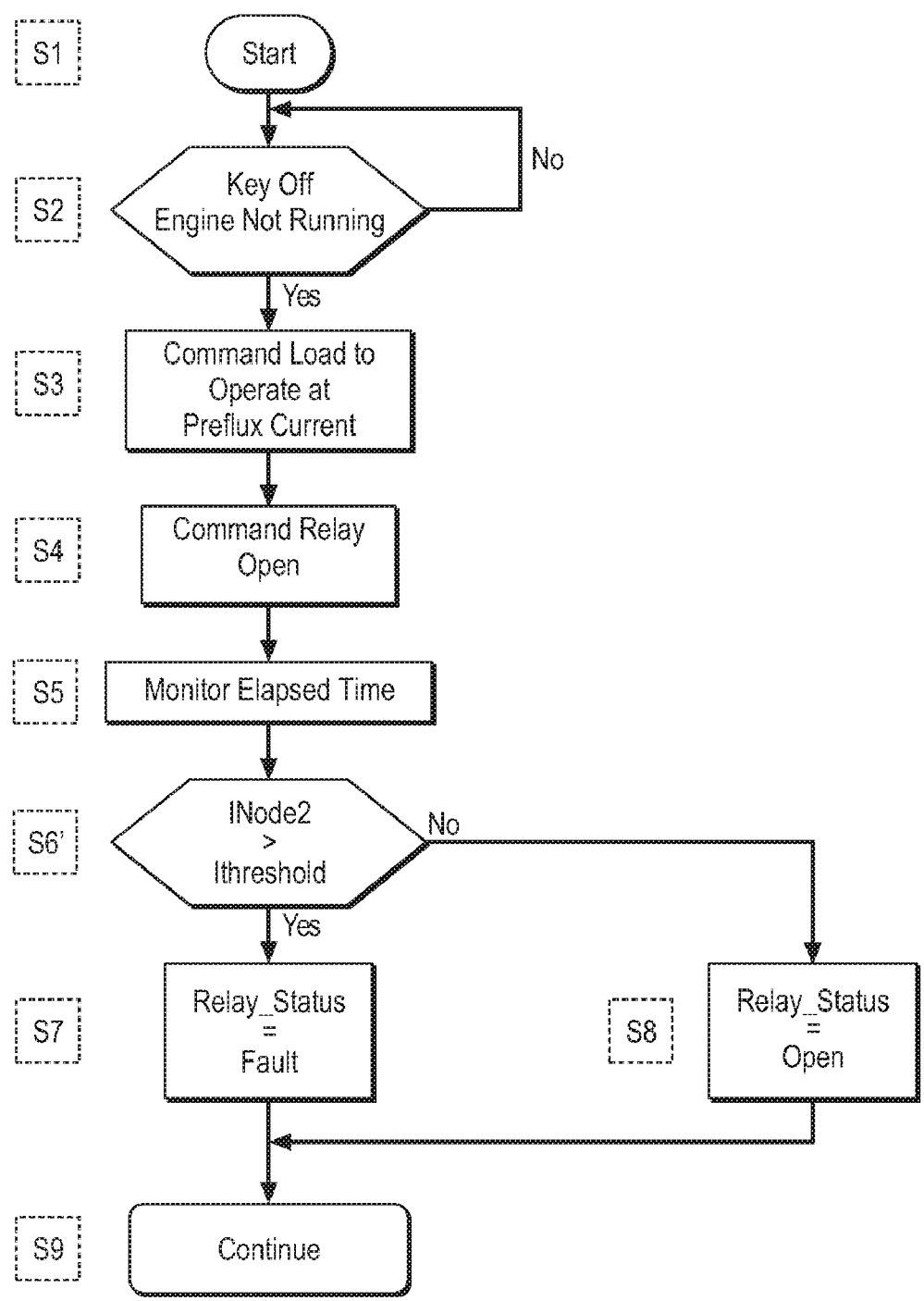

Referring now to FIGS. 3 and 4, exemplary algorithms for diagnosing operation of the relay 10, and executable in the controller 5, are described. The algorithm described with reference to FIG. 3 corresponds to the system described and detailed in FIG. 1, i.e. a system using voltage monitoring to detect a stuck or malfunctioning relay. The algorithm described with reference to FIG. 4 corresponds to the system described and detailed in FIG. 2, i.e. a system using current monitoring to detect a malfunction. After start of the engine and vehicle, S1, the controller 5 monitors engine operation and key position to detect a key-off and engine not running (S2), which typically comprises electronic flags set and communicated to controller 5. Once key-off and engine not running has been detected, the load device 30 is commanded to operate at the preflux current (S3), and the relay 10 is commanded open (S4). The controller may, alternatively, choose to observe the status of the load device 30 prior to commanding the relay 10 open, to accommodate a system or situation wherein precise control of the load device is not readily achievable, thus negating the ability to command the device 30 to operate at the preflux current. An elapsed time is monitored (S5), preferably in the range of less than one second. With reference now to FIG. 3, $V_{Node1}$ represents voltage measured at first node 14, and $V_{Node2}$ represents voltage measured at second node 16. The controller 5 measures $V_{Node1}$ and $V_{Node2}$ using electrical connections to first and second nodes 14, 16 to the A/D converter. A difference, $V_{Node1}-V_{Node2}$, is calculated, and compared to a threshold voltage, $V_{threshold}$, (S6). $V_{threshold}$ is readily calibratable by a skilled practitioner based upon system design characteristics and monitored elapsed time of Step S5. When $V_{Node1}-V_{Node2}$, is greater than threshold voltage, $V_{threshold}$, the system determines the relay 10 is open (S8), and therefore the status of the relay is that it is functioning properly, and continues (S9). When $V_{Node1}-V_{Node2}$, is less than threshold voltage, $V_{threshold}$, the system determines the relay 10 is stuck closed, and therefore the status of the relay is that a fault has occurred (S7), and continues (S9). The controller 5 preferably discontinues the command to the load 30 to operate at the preflux current, and discontinues the command to the relay 10 to open. The controller 5 communicates status of the relay 10 to a second controller or to another device that is operable to track status of various systems in the vehicle, and act in accordance with other requirements related to monitoring status of vehicle systems and operator notification.

With reference now to FIG. 4, $I_{Node2}$ represents current measured at after second node 16, and comprises the current supplied to the load device 30. The controller 5 measures $I_{Node2}$ using the current sensor 22 which is connected to the A/D converter. Current, $I_{Node2}$, measured after elapsed time since commanding load 30 to operate at the preflux current (S3) and commanding the relay 10 open (S4), is compared to a threshold current $I_{threshold}$ (S6'). $I_{threshold}$ is readily calibratable by a skilled practitioner based upon system design characteristics and monitored elapsed time of Step S5. When $I_{Node2}$ is less than threshold current, $I_{threshold}$, the system determines the relay 10 is open (S8), and therefore the status of the relay is that it is functioning properly, and continues (S9). When $I_{Node2}$ is greater than threshold current, $I_{threshold}$, the system determines the relay 10 is stuck closed, and therefore the status of the relay is that a fault has occurred (S7), and continues (S9). The controller 5 preferably discontinues the command to the load 30 to operate at the preflux current, and discontinues the command to the relay 10 to open. The controller 5 preferably communicates status of the relay 10 to a second controller or to another device that is operable to track status of various systems in the vehicle, and act in accordance with other requirements related to monitoring status of vehicle systems and operator notification.

The invention has been described with specific reference to the preferred embodiments and modifications thereto. Further modifications and alterations may occur to others upon reading and understanding the specification. It is intended to include all such modifications and alterations insofar as they come within the scope of the invention.

The invention claimed is:

1. System for monitoring an electrical relay operable to conduct electrical power from a source to a load device in an operator controlled vehicle, comprising:
   an electrical relay including a pair of electrical contacts controllably opened and closed;
   a resistive device, permanently electrically connected across the pair of electrical contacts such that when the pair of electrical contacts is closed the resistive device is substantially shorted by the closed electrical contacts and when the pair of electrical contacts is open the resistive device is in circuit between the open electrical contacts;
   a controllable electrical load device electrically connected to an electrical power source through the resistive device when the pair of electrical contacts is open and primarily through the pair of electrical contacts when the pair of electrical contacts is closed and the resistive device is substantially shorted by the closed electrical contacts;
   at least one sensing device measuring one of a) voltage across the resistive device and b) actual current supplied to the controllable electrical load device; and,
   a controller identifying a vehicle shutdown command from the operator,
   commanding the controllable electrical load device to operate at a known current draw level,
   commanding the relay to open the pair of electrical contacts, and
   determining from the measured one of a) voltage across the resistive device and b) actual current supplied to the controllable electrical load device, and a corresponding voltage threshold and current threshold, respectively, whether the pair of electrical contacts has opened.

2. The system of claim 1, wherein: said at least one sensing device comprises a sensing device configured to measure a first voltage at a first terminal of the resistive device, and a sensing device configured to measure a second voltage at a second terminal of the resistive device; and said controller is configured to diagnose from the measured first and second voltages whether the pair of electrical contacts are open or closed.

3. The system of claim 2, wherein said controller is configured to diagnose the pair of electrical contacts is closed when the first and second voltages differ by less than the voltage threshold.

4. The system of claim 2, wherein said controller is configured to diagnose the pair of electrical contacts is open when the first and second voltages differ by more than the voltage threshold.

5. The system of claim 1, wherein: said at least one sensing device comprises a current sensing device configured to measure actual current supplied to the controllable electrical load device; and said controller is configured to diagnose from the actual current supplied to the controllable electrical load device whether the pair of electrical contacts are open or closed.

6. The system of claim 5, wherein said controller is configured to diagnose the pair of electrical contacts is closed when the actual current supplied to the controllable electrical load device is greater than the current threshold.

7. The system of claim 5, wherein said controller is configured to diagnose the pair of electrical contacts is open when the actual current supplied to the controllable electrical load device is less than the current threshold.

8. The system of claim 1, further comprising a capacitive storage device, electrically connected to the controllable electrical load device in a parallel circuit.

9. The system of claim 8, wherein the electrical relay comprises a pulse-width modulation-controlled high voltage relay device configured to conduct electrical current.

10. The system of claim 9, wherein the electrical power source comprises an energy storage device.

11. The system of claim 10, wherein the resistive device comprises an electrical resistor having an electrical resistance of about 1500 ohms.

12. Method to monitor a pair of electrical contacts of an electrical relay in a circuit conducting current from an electrical storage device to a controllable electrical load device in an operator controlled vehicle, comprising:
   a. equipping the electrical relay with a resistive device permanently electrically connected across the pair of electrical contacts such that when the pair of electrical contacts is closed the resistive device is substantially shorted by the closed electrical contacts and when the pair of electrical contacts is open the resistive device is in circuit between the open electrical contacts;

b. identifying a vehicle shut down command from the operator;

c. commanding the controllable electrical load device to operate at a known current draw level simultaneously while the electric relay is commanded to open the pair of electrical contacts;

d. measuring one of a) voltage across the resistive device and b) actual current supplied to the controllable electrical load device; and e. diagnosing from the measured one of a) voltage across the resistive device and b) actual current supplied to the controllable electrical load device, and a corresponding voltage threshold and current threshold, respectively, whether the pair of electrical contacts has opened.

13. The method of claim 12, wherein commanding the controllable electrical load device to operate at a known current draw level comprises commanding the controllable electrical load device to operate at a substantially fixed current level that is less than about one ampere.

14. The method of claim 12, wherein measuring one of a) voltage across the resistive device and b) actual current supplied to the controllable electrical load device comprises measuring voltage across the resistive device and diagnosing from the measured voltage across the resistive device and a corresponding voltage threshold whether the pair of electrical contacts has opened comprises comparing the voltage across the resistive device to the voltage threshold.

15. The method of claim 12, wherein measuring one of a) voltage across the resistive device and b) actual current supplied to the controllable electrical load device comprises measuring actual current supplied to the controllable electrical load device and diagnosing from the measured current supplied to the controllable electrical load device and a corresponding current threshold whether the pair of electrical contacts has opened comprises comparing the actual current supplied to the controllable electrical load device to the current threshold.

* * * * *